US008420476B2

(12) United States Patent
Booth, Jr. et al.

(10) Patent No.: US 8,420,476 B2
(45) Date of Patent: Apr. 16, 2013

(54) INTEGRATED CIRCUIT WITH FINFETS AND MIM FIN CAPACITOR

(75) Inventors: Roger A. Booth, Jr., Wappingers Falls, NY (US); Kangguo Cheng, Guilderland, NY (US); Toshiharu Furukawa, Essex Junction, VT (US); Chengwen Pei, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 203 days.

(21) Appl. No.: 12/789,013

(22) Filed: May 27, 2010

(65) Prior Publication Data
US 2011/0291166 A1 Dec. 1, 2011

(51) Int. Cl.
*H01L 21/8238* (2006.01)

(52) U.S. Cl.
USPC .............. 438/210; 257/289; 257/E21.647

(58) Field of Classification Search .......... 438/210, 438/241, 250, 253, 275, 393, 396; 257/296, 257/365, 532, E29.343, E21.008, E21.014, 257/289, E21.647
See application file for complete search history.

(56) References Cited

U.S. PATENT DOCUMENTS

| | | | | |
|---|---|---|---|---|
| 5,668,035 | A * | 9/1997 | Fang et al. | 438/239 |
| 5,953,599 | A * | 9/1999 | El-Diwany | 438/199 |
| 6,037,222 | A * | 3/2000 | Huang et al. | 438/257 |
| 6,207,509 | B1 * | 3/2001 | Inoue | 438/275 |
| 6,218,234 | B1 * | 4/2001 | Yu et al. | 438/241 |
| 6,242,300 | B1 * | 6/2001 | Wang | 438/241 |
| 6,252,284 | B1 * | 6/2001 | Muller et al. | 257/412 |
| 6,277,676 | B1 * | 8/2001 | Wu | 438/142 |
| 6,291,307 | B1 * | 9/2001 | Chu et al. | 438/393 |
| 6,413,802 | B1 * | 7/2002 | Hu et al. | 438/151 |
| 6,417,037 | B1 * | 7/2002 | Feng | 438/216 |
| 6,482,740 | B2 | 11/2002 | Soininen et al. | |
| 6,503,800 | B2 * | 1/2003 | Toda et al. | 438/279 |
| 6,620,700 | B2 * | 9/2003 | Prinslow et al. | 438/393 |
| 6,642,090 | B1 * | 11/2003 | Fried et al. | 438/164 |
| 6,872,627 | B2 * | 3/2005 | Chen et al. | 438/303 |
| 6,878,628 | B2 | 4/2005 | Sophie et al. | |
| 6,919,256 | B2 | 7/2005 | Inoue et al. | |
| 6,995,415 | B2 * | 2/2006 | Ogawa et al. | 257/296 |
| 7,273,787 | B2 * | 9/2007 | Chen et al. | 438/275 |
| 7,361,950 | B2 * | 4/2008 | Chinthakindi et al. | 257/301 |
| 7,378,357 | B2 | 5/2008 | Clark, Jr. et al. | |
| 7,476,946 | B2 | 1/2009 | Bryant et al. | |
| 7,994,037 | B2 * | 8/2011 | Trentzsch et al. | 438/591 |
| 2002/0004277 | A1 * | 1/2002 | Ahn et al. | 438/275 |
| 2003/0193058 | A1 | 10/2003 | Fried et al. | |
| 2003/0197194 | A1 * | 10/2003 | Fried et al. | 257/200 |
| 2004/0113229 | A1 * | 6/2004 | Gonzalez et al. | 257/509 |
| 2004/0124477 | A1 * | 7/2004 | Minami et al. | 257/379 |

(Continued)

OTHER PUBLICATIONS

International Search Report dated Jun. 24, 2011 in International Application No. PCT/US2011/030675, 4 pages.

*Primary Examiner* — Matthew Landau
*Assistant Examiner* — Joseph C Nicely
(74) *Attorney, Agent, or Firm* — David Cain; Roberts Mlotkowski Safran & Cole, P.C.

(57) ABSTRACT

An integrated circuit having finFETs and a metal-insulator-metal (MIM) fin capacitor and methods of manufacture are disclosed. A method includes forming a first finFET comprising a first dielectric and a first conductor; forming a second finFET comprising a second dielectric and a second conductor; and forming a fin capacitor comprising the first conductor, the second dielectric, and the second conductor.

27 Claims, 9 Drawing Sheets

U.S. PATENT DOCUMENTS

| | | |
|---|---|---|
| 2004/0147084 A1 | 7/2004 | Inoue et al. |
| 2005/0250342 A1 | 11/2005 | Ueda |
| 2006/0038216 A1 | 2/2006 | Fried et al. |
| 2007/0018239 A1 | 1/2007 | Chen et al. |
| 2007/0080387 A1 | 4/2007 | Liu et al. |
| 2007/0117311 A1 | 5/2007 | Zaman |
| 2007/0218598 A1* | 9/2007 | Niimi et al. .................. 438/147 |
| 2008/0145985 A1* | 6/2008 | Chi ................................ 438/199 |
| 2008/0203468 A1* | 8/2008 | Cheng et al. .................. 257/327 |
| 2008/0237675 A1 | 10/2008 | Doyle et al. |
| 2008/0296648 A1* | 12/2008 | Zhu ................................ 257/300 |
| 2009/0001438 A1* | 1/2009 | Doyle et al. .................. 257/306 |
| 2009/0030913 A1 | 1/2009 | Gyure et al. |
| 2009/0039438 A1* | 2/2009 | Liu ................................ 257/369 |
| 2009/0057765 A1* | 3/2009 | Zhu et al. ...................... 257/351 |
| 2009/0072328 A1* | 3/2009 | Son ................................ 257/411 |
| 2009/0090990 A1* | 4/2009 | Niimi et al. .................. 257/500 |
| 2009/0108316 A1 | 4/2009 | Xiong et al. |
| 2009/0124069 A1 | 5/2009 | Clark, Jr. et al. |
| 2010/0002494 A1 | 1/2010 | Xiong et al. |
| 2010/0013022 A1* | 1/2010 | Heung-Jae et al. ........... 257/369 |
| 2010/0025770 A1* | 2/2010 | Trentzsch et al. ............. 257/369 |
| 2010/0270619 A1* | 10/2010 | Lee ................................ 257/365 |
| 2011/0079837 A1* | 4/2011 | Doyle et al. .................. 257/310 |
| 2011/0269280 A1* | 11/2011 | Wang et al. ................... 438/270 |
| 2012/0025385 A1 | 2/2012 | McDaniel et al. ............ 257/768 |
| 2012/0119297 A1* | 5/2012 | Schulz .......................... 257/365 |
| 2012/0161207 A1* | 6/2012 | Homyk et al. ................ 257/253 |

* cited by examiner

INTEGRATED CIRCUIT WITH FINFETS AND MIM FIN CAPACITOR

FIELD OF THE INVENTION

The invention relates to a semiconductor structures and methods of manufacture and, more particularly, to an integrated circuit having finFETs and a metal-insulator-metal (MIM) fin capacitor and methods of manufacture.

BACKGROUND

As integrated circuits continue to scale downward in size, the finFET (fin field effect transistor) is becoming an attractive device for use with smaller nodes, e.g., the 22 nm node and beyond. In a finFET, the channel is formed by a semiconductor fin and a gate electrode is located on at least two sides of the fin. Due to the advantageous feature of full depletion in a finFET, the increased number of sides on which the gate electrode controls the channel of the finFET enhances the controllability of the channel in a finFET compared to a planar MOSFET. The improved control of the channel allows smaller device dimensions with less short channel effects as well as larger electrical current that can be switched at high speeds. A finFET device generally has faster switching times, equivalent or higher current density, and much improved short channel control than planar CMOS technology utilizing similar critical dimensions.

For finFET technology to be viable, it is necessary to be able to construct devices with different operating voltages and threshold voltages. For example, a circuit design might require I/O devices that operate at a first voltage and high-performance logic devices that operate at a second, different voltage be fabricated on the same chip. Additionally, chips may include devices having different threshold voltages (Vt) in order to meet various performance and/or power requirements of a design.

Moreover, on-chip capacitors are commonly used as decoupling capacitors to suppress power supply noise. Planar metal-insulator-metal (MIM) capacitors suffer from a low capacitance per area. Fin-based metal-oxide-semiconductor (fin MOS) capacitors exhibit relatively better capacitance per area than planar MIM capacitors; however, conventional fin MOS capacitors have poor performance due to the high resistance of the narrow semiconductor fins.

Accordingly, there exists a need in the art to overcome the deficiencies and limitations described hereinabove.

SUMMARY

In a first aspect of the invention, there is a method of fabricating a semiconductor structure. The method includes forming a first finFET comprising a first dielectric and a first conductor; forming a second finFET comprising a second dielectric and a second conductor; and forming a fin capacitor comprising the first conductor, the second dielectric, and the second conductor.

In another aspect of the invention, there is a method of fabricating a semiconductor structure. The method includes: forming a first, second, and third fins of semiconductor material on a substrate; forming a first finFET comprising a first dielectric and a first conductor on the first fin; forming a second finFET comprising a second dielectric and a second conductor on the first fin; and forming a fin capacitor comprising the first conductor, the second dielectric, and the second conductor on the third fin. The first finFET has a first threshold voltage and the second finFET has a second threshold voltage different from the first threshold voltage.

In yet another aspect of the invention, there is a method of fabricating a semiconductor structure. The method includes: forming a layer of a first dielectric on a first fin, a second fin, and a third fin; forming a layer of a first conductor on the layer of the first dielectric over the first fin, the second fin, and the third fin; and removing the first dielectric and the first conductor from over the third fin. The method also includes: forming a layer of a second dielectric over the first fin, the second fin, and the third fin; forming a layer of a second conductor over the first fin, the second fin, and the third fin; and removing the second dielectric and the second conductor from over the first fin.

In accordance with further aspects of the invention, there is a semiconductor structure including: a first finFET comprising a portion of a layer of a first dielectric and a portion of a layer of a first conductor; a second finFET comprising a portion of a layer of a second dielectric and a portion of a layer of a second conductor; and a fin capacitor comprising another portion of the layer of the first conductor, another portion of the layer of the second dielectric, and another portion of the layer of the second conductor.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to a semiconductor structures and methods of manufacture and, more particularly, to an integrated circuit having finFETs and a MIM fin capacitor and methods of manufacture. In accordance with aspects of the invention, a method is provided for forming plural finFETs having different threshold voltages (Vt) and one or more metal-insulator-metal (MIM) fin capacitors on the same integrated circuit chip. In embodiments, the MIM fin capacitors are formed simultaneously with the finFET process (fabrication) flow, which results in the MIM fin capacitors being substantially cost-free in terms of extra processing steps.

In accordance with further aspects of the invention, the MIM fin capacitors are formed on fins, which results in enhanced capacitance per area in comparison to conventional planar MIM capacitors. Additionally, the MIM fin capacitors of embodiments of the invention have better performance than fin MOS capacitors due to the lower resistance of the metal layers compared to that of semiconductor fins used in fin MOS capacitors.

In embodiments, at least two finFETs and at least one MIM fin capacitor are simultaneously formed on a chip. According to aspects of the invention, a first finFET comprises a first dielectric and a first conductor on a first fin, a second finFET comprises a second dielectric and a second conductor on a second fin, and a MIM fin capacitor comprises the first conductor, the second dielectric, and the second conductor formed on a third fin.

Figure 1:
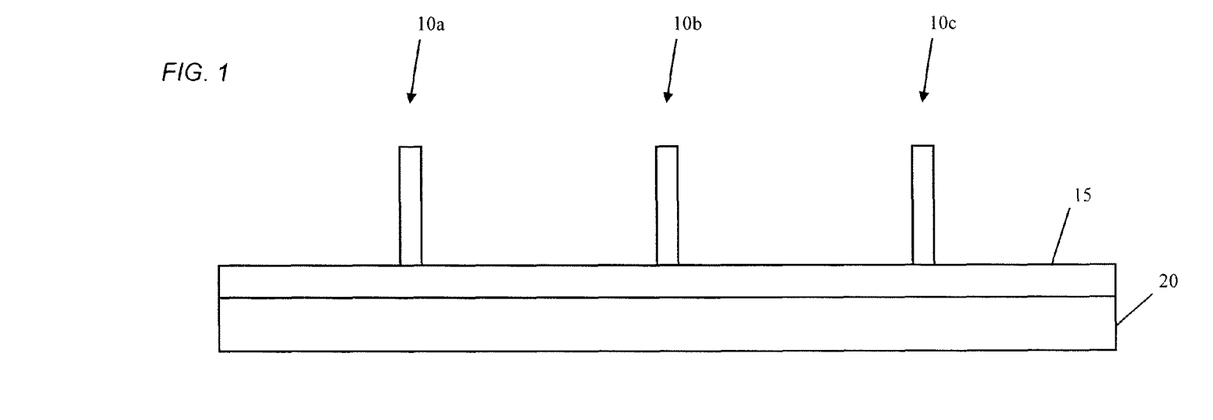
FIGS. 1-7, 8A, 8B, 9A, 9B, 10, 11A, and 11B show processing steps and structures associated with aspects of the invention.

FIGS. 1-7, 8A, 8B, 9A, 9B, 10, 11A, and 11B show processing steps and structures associated with forming a semiconductor device in accordance with aspects of the invention. As depicted in FIG. 1, at least three fins 10a-c are formed on an insulator layer 15 atop a substrate 20. The fins 10a-c may comprise, for example, a monolith of silicon or any other suitable semiconductor material formed on the insulator layer 15 using conventional semiconductor processing techniques. In embodiments, the insulator layer 15 comprises a buried oxide (BOX) layer formed atop the substrate 10 in any desired conventional manner. In embodiments, each of the fins 10a-c has a height of about 30 nm and a width of about 15 nm; however, the invention is not limited to these values and fins having any suitable dimensions may be used within the scope of the invention. Moreover, more than three fins may be used to form more than any desired number of devices described herein.

Figure 2:
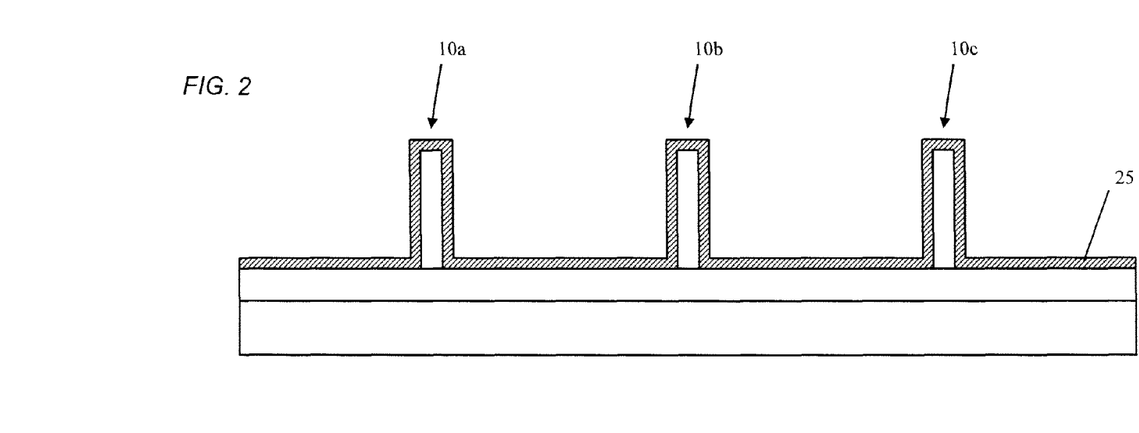

As depicted in FIG. 2, a layer of first dielectric 25 is formed on the fins 10a-c and the exposed upper surface of the insulator layer 15. In embodiments, the first dielectric 25 comprises a high-k dielectric such as hafnium oxide formed using chemical vapor deposition (CVD). However, the invention is not limited to the use of hafnium oxide, and the first dielectric 25 may be composed of other materials including but not limited to: silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as lanthanum, aluminum, etc.

Furthermore, although CVD is described for forming the first dielectric 25, the first dielectric 25 may be formed by any suitable process such as, for example: thermal oxidation, chemical oxidation, thermal nitridation, atomic layer deposition (ALD), molecular layer deposition (MLD), chemical vapor deposition (CVD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), in-situ radical assisted deposition, high temperature oxide deposition (HTO), low temperature oxide deposition (LTO), ozone/TEOS deposition, limited reaction processing CVD (LRPCVD), ultrahigh vacuum chemical vapor deposition (UHVCVD), metalorganic chemical vapor deposition (MOCVD), molecular beam epitaxy (MBE), physical vapor deposition, sputtering, plating, evaporation, spin-on-coating, ion beam deposition, electron beam deposition, laser assisted deposition, chemical solution deposition, or any combination of the aforementioned.

In accordance with aspects of the invention, the first dielectric 25 functions as a gate dielectric for a first finFET. As such, the thickness and material composition of the first dielectric 25 influences the operational characteristics (e.g., threshold voltage, etc.) of the first finFET. In embodiments, the first dielectric 25 has a thickness of about 10 Angstroms to about 50 Angstroms; however, the invention is not limited to these values and any suitable thickness may be employed within the scope of the invention.

Figure 3:
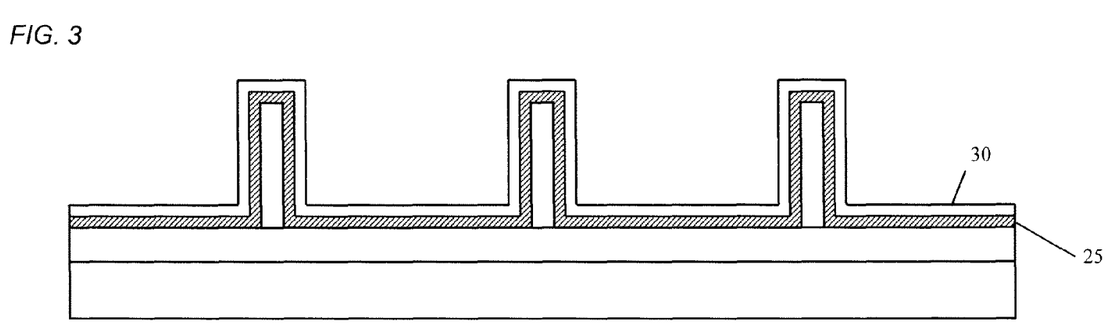

As depicted in FIG. 3, a layer of first conductor 30 is formed on the first dielectric 25. In embodiments, the first conductor 30 comprises titanium nitride (TiN) deposited by CVD. However, the invention is not limited to the use of titanium nitride, and the first conductor 30 may be composed of other materials including but not limited to: polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The conductive material may further comprise dopants that are incorporated during or after deposition. Moreover, the first conductor 30 is not limited to formation using CVD, but rather any suitable process, such as those described above, may be used to form the first conductor 30.

In accordance with aspects of the invention, the first conductor 30 functions as a gate conductor for the first finFET. In embodiments, the first conductor 30 has a thickness of about 30 Angstroms to about 100 Angstroms; however, the invention is not limited to these values and any suitable thickness may be employed within the scope of the invention.

Figure 4:
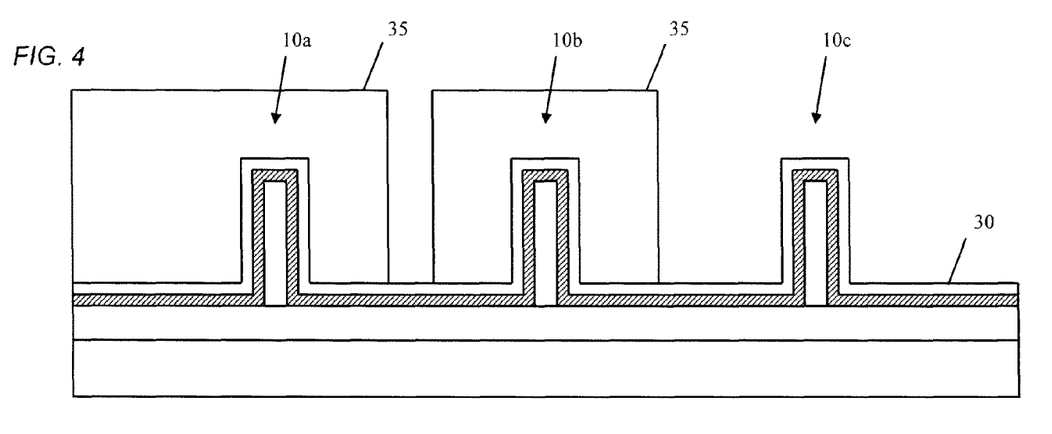

As depicted in FIG. 4, a mask 35 is formed on the first conductor 30 over a fin corresponding to the first finFET (e.g., fin 10a) and a fin corresponding to the capacitor (e.g., fin 10b). The mask 35 may be any suitable mask such as a photoresist material or a hardmask (e.g., oxide, nitride, etc.) that is formed and patterned using conventional semiconductor fabrication techniques. According to aspects of the invention, the mask 35 is patterned such that it does not cover a fin corresponding to the second finFET (e.g., fin 10c). In accordance with further aspects of the invention, the mask 35 is patterned such that it is not continuous between the fin 10a of the first finFET and the fin 10b of the capacitor, thereby leaving a portion of the first conductor 30 exposed between the first finFET and the capacitor.

Figure 5:
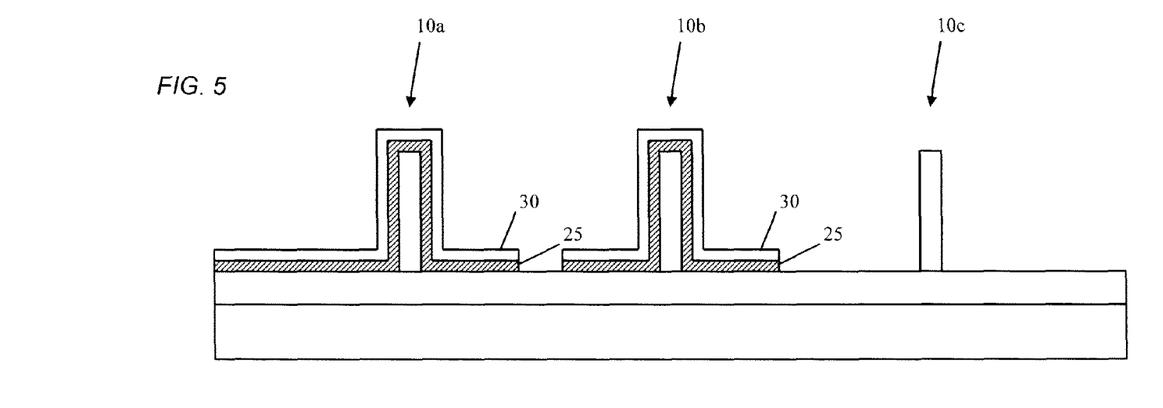

As depicted in FIG. 5, the unmasked portions of the first conductor 30 and first dielectric 25 are removed, after which the mask is removed. According to aspects of the invention, this removal results in the first conductor 30 and first dielectric 25 being removed from the fin 10c of the second finFET, and also results in a discontinuity being formed in the first conductor 30 and first dielectric 25 between the first finFET and the capacitor. In embodiments, the unmasked portions of the first conductor 30 and first dielectric 25 are removed using different etch processes. For example, when the first conductor 30 comprises titanium nitride, a wet etch solution containing hydrogen peroxide and ammonia may be used to remove the titanium nitride. Moreover, when the first dielectric 25 comprises hafnium oxide, ion bombardment in conjunction with wet etch may be used to remove the hafnium oxide. The invention is not limited to these specific material removal processes, however, and any suitable methods may be used. For example, when the first dielectric 25 comprises silicon oxide, a wet etch solution containing hydrofluoric acid can be used to remove the silicon oxide.

Figure 6:
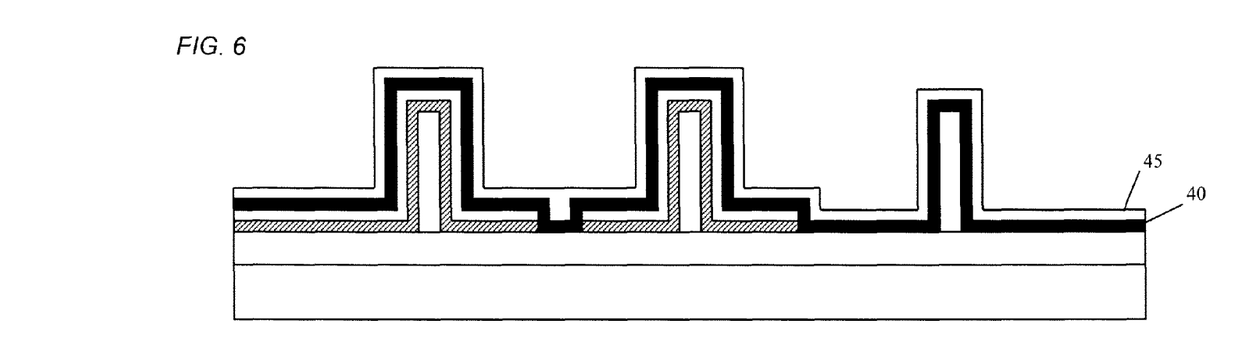

As depicted in FIG. 6, a layer of second dielectric 40 is formed on the exposed upper surfaces of the semiconductor structure. Also, a layer of second conductor 45 is formed on the second dielectric 40. In embodiments, the second dielectric 40 is composed of hafnium oxide doped with lanthanum deposited by CVD, and the second conductor 45 is composed of titanium nitride deposited by CVD. However, the invention is not limited to these materials and deposition processes, and any suitable materials and processes, such as those described above, may be used to form the second dielectric 40 and the second conductor 45. In embodiments, the second dielectric 40 serves as a gate dielectric for the second finFET and the second conductor 45 functions as a gate conductor for the second finFET. Accordingly, in implementations of the invention, the thickness and/or material of at least one of the second dielectric 40 and the second conductor 45 may be selectively chosen to impart desired device characteristics (e.g., threshold voltage, etc.) in the second finFET.

Figure 7:
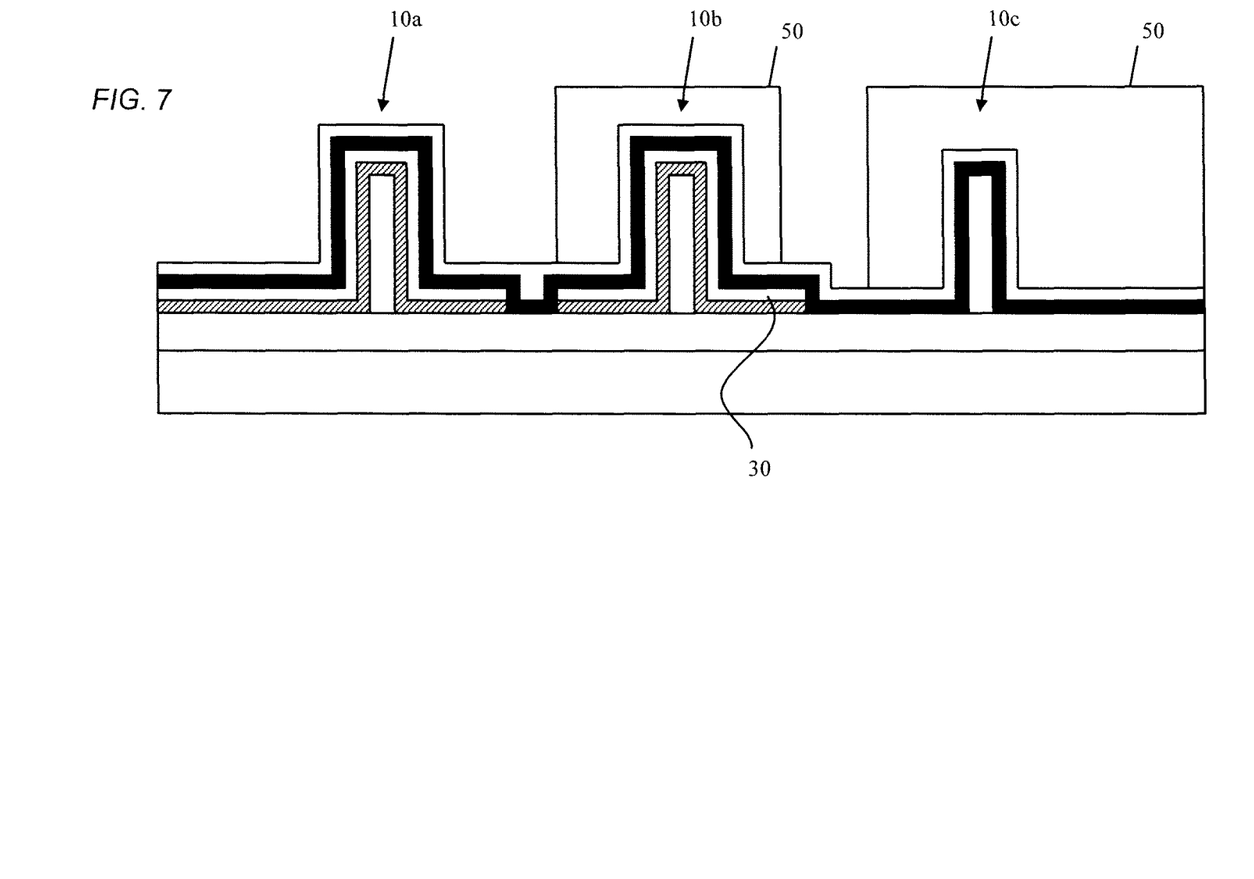

As depicted in FIG. 7, a mask 50 is formed over the fin 10c of the second finFET and the fin 10b of the capacitor. The mask 50 may be formed in a similar manner as mask 35 described above. The mask 50 is formed such that it does not cover the entirety of the first conductor 30 associated with the capacitor. In this manner, a portion of the first conductor 30 of the capacitor may be exposed in subsequent steps, as described in greater detail herein.

Figure 8A:
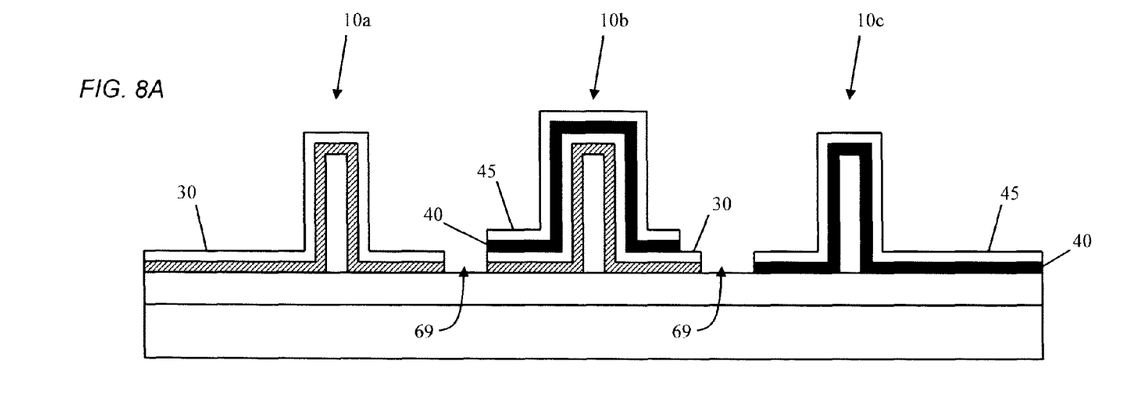

As depicted in FIG. 8A, the unmasked portions of the second conductor 45 and second dielectric 40 are removed, after which the mask 50 is removed. In embodiments, the unmasked portions of the second conductor 45 and second dielectric 40 are removed using respective etch processes, in a manner similar to that described above with respect to the removal of the unmasked portions of the first conductor 30 and first dielectric 25. In embodiments, the second conductor 45 and second dielectric 40 are removed completely from the first finFET 60a. Also, a portion of the second conductor 45 and second dielectric 40 are removed from the capacitor 65.

Figure 8B:
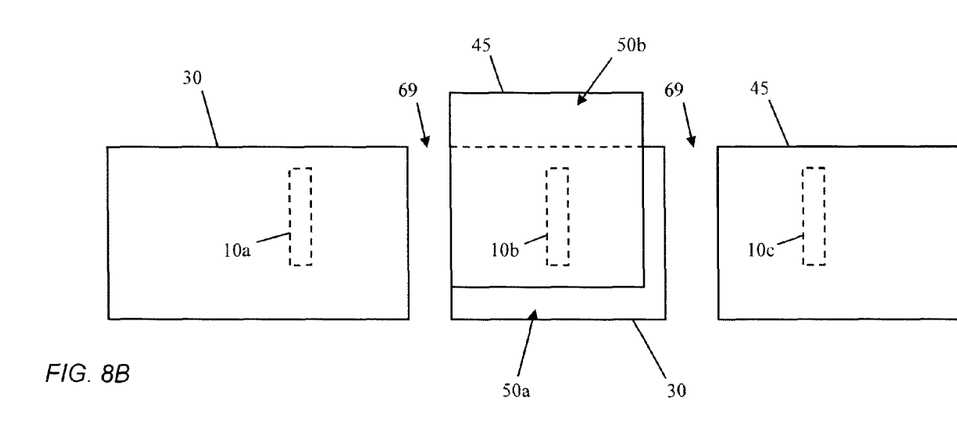

FIG. 8B is a top down view corresponding to FIG. 8A and depicts respective coverage of the first conductor 30 and the second conductor 45 over areas of the first finFET 60a including fin 10a, second finFET 60b including fin 10c, and capacitor 65 including fin 10b. As depicted in FIG. 8B and as described above, a portion of the second conductor 45 and second dielectric 40 are removed from the capacitor to expose a portion of the first conductor 30. This results in the capacitor having a first contact area 50a of exposed first conductor 30 and a second contact area 50b of exposed second conductor 45.

Figure 9A:
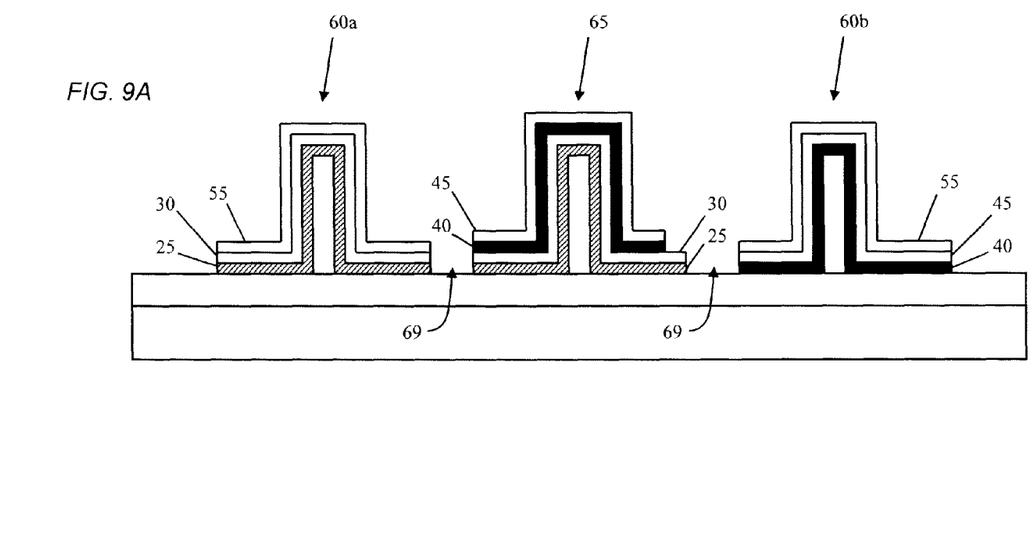
Figure 9B:
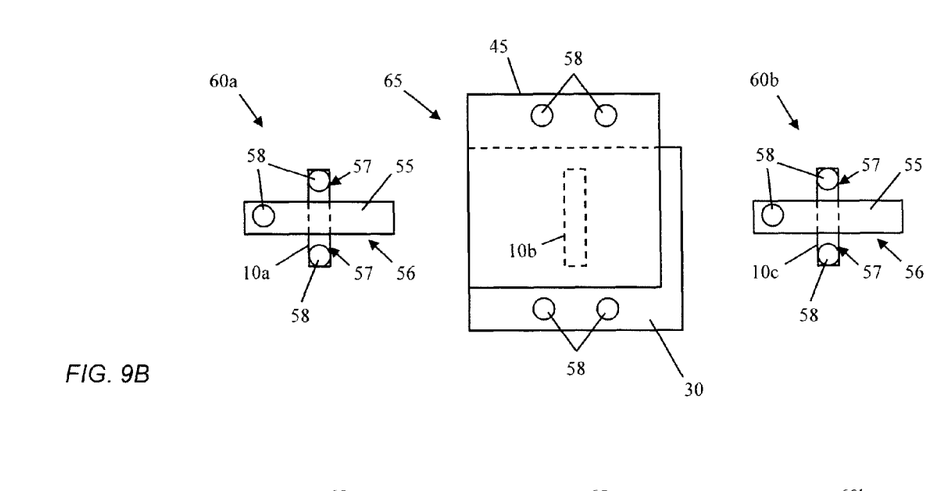

As depicted in FIGS. 9A and 9B, the first and second finFETs 60a and 60b are processed to form respective gates and contacts for these devices. FIG. 9B is a top down view corresponding to FIG. 9A. In embodiments, a layer of polysilicon 55 is formed on the first and second finFETs, after which the polysilicon 55, the first conductor 30, the second conductor 45, the first dielectric 25, and second dielectric 40 are patterned on each respective finFET to form a gate 56 at each finFET. The gates 56 may be formed simultaneously on both the first and second finFET. Additionally, source and drain regions 57 may be formed in the first and second finFETs by performing ion implantation in the fins 10a and 10c. Moreover, silicide regions 58 may be formed at desired locations, e.g., for contacts, on both the first and second finFET. The gates 56, source and drain regions 57, and silicide regions 58 may be formed using conventional semiconductor processing techniques.

The resulting structure includes: a first finFET 60a in which the first dielectric 25 is a gate dielectric and the first conductor 30 is a gate conductor (e.g., gate metal); a second finFET 60b in which the second dielectric 40 is a gate dielectric and the second conductor 45 is a gate conductor (e.g., gate metal); and a MIM fin capacitor 65 in which the first conductor 30 is a first capacitor conductor, the second dielectric 40 is the capacitor dielectric, and the second conductor 45 is the second capacitor conductor. As such, implementations of the invention provide for the simultaneous formation of at least two finFETs and at least one MIM fin capacitor on a chip, in which the MIM fin capacitor includes materials in common with each of the respective finFETs.

As shown in FIGS. 8A, 8B, 9A, and 9B, the first finFET 60a, the second finFET 60b, and the capacitor 65 are all isolated from one another. This is depicted, for example, by isolation gaps 69 between the devices. The isolation gaps 69 represent discontinuities of the respective layers (e.g., 25, 30, 40, and 45) such that the devices are not electrically connected to one another through these layers.

Figure 10:
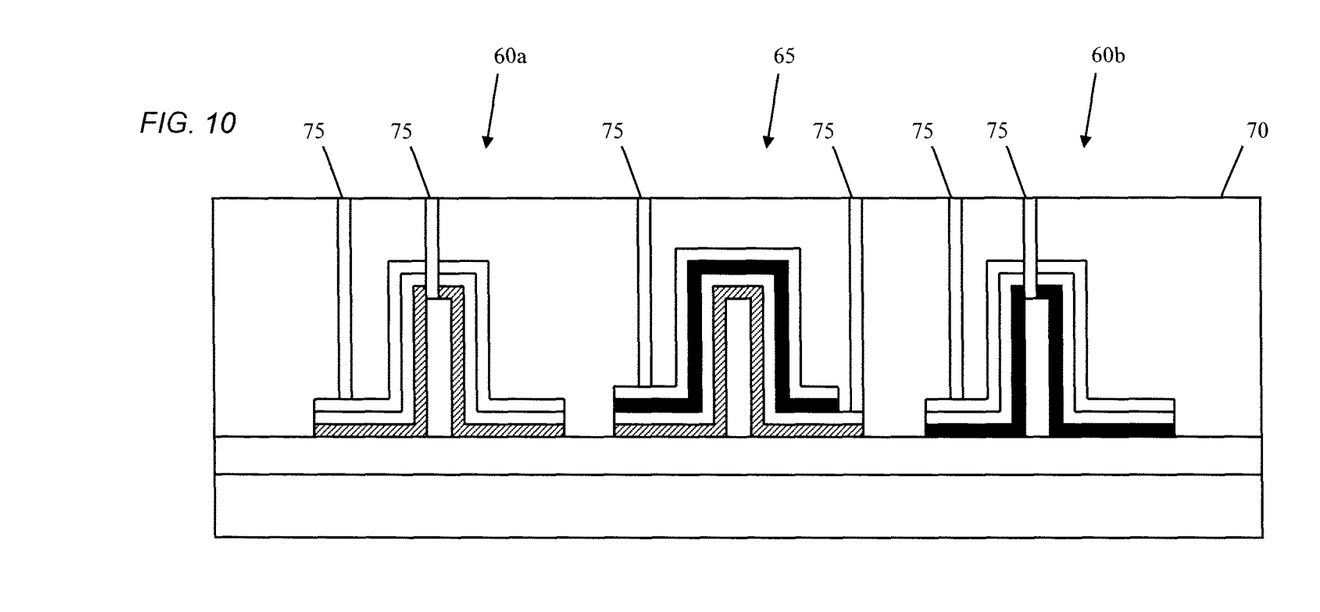

As depicted in FIG. 10, a dielectric layer 70 may be formed over the entire structure, and conductive contacts 75 may be formed in the dielectric layer to provide electrical connections to respective portions of the first finFET 60a and second finFET 60b and the capacitor 65. The dielectric layer 70 and contacts 75 may be may be formed using conventional semiconductor processing techniques. The contacts 75 may be any suitable material, including but not limited to copper, tungsten, etc.

Figure 11A:
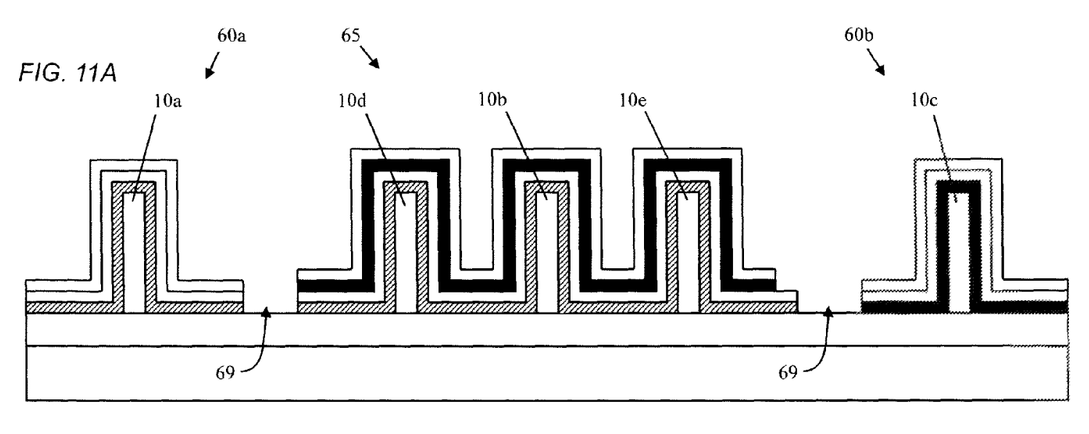
Figure 11B:
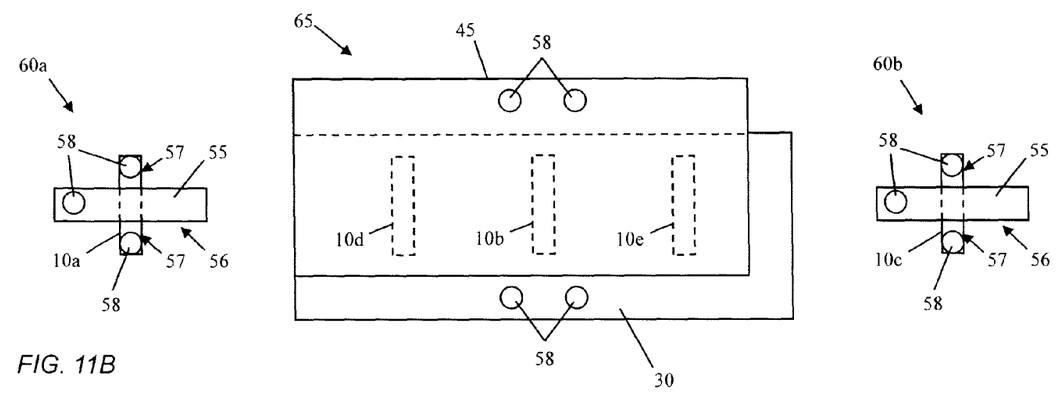

As depicted in FIGS. 11A and 11B, and in accordance with further aspects of the invention, the MIM fin capacitor may be formed using more than one fin. FIG. 11B is a top down view corresponding to FIG. 11A. The processing steps are substantially the same as described above with respect to FIGS. 1A and 1B through 10A and 10B, except that the various layers forming the capacitor 65 are deposited across plural fins, e.g., fins 10b, 10d, and 10e. In embodiments, the use of plural fins in the MIM fin capacitor increases the capacitance. Although three 10b, 10d, and 10e fins are shown, the invention is not limited to any particular number of fins; instead, a MIM fin capacitor 65 may be formed with any desired number of fins within the scope of the invention. Isolation gaps 69 are present between the respective devices; however, there are no such gaps between the plural fins of the capacitor 65.

In accordance with aspects of the invention, the first and second finFETs may be configured with different device characteristics by appropriately selecting the materials of the first dielectric, first conductor, second dielectric, and second conductor. In embodiments, the first dielectric is composed of a different material than the second dielectric and/or the first conductor is composed of a different material than the second conductor. For example, the first dielectric may be composed of hafnium oxide while the second dielectric is composed of hafnium oxide doped with lanthanum. In this manner, the first and second finFETs have different gate stacks due to the different gate dielectric materials, and thus have different threshold voltages. Accordingly, in implementations of the invention, two finFETs having different device characteristics may be formed on the same chip.

In accordance with further aspects of the invention, the respective thicknesses of the first dielectric and the second dielectric may be selected to produce a particular characteristic in the capacitor. In a particular embodiment, the first dielectric is about 1.5 to about 2.0 times thicker than the second dielectric, which results in a high-density MIM fin capacitor. In another embodiment, the second dielectric is about 1.5 to about 2.0 times thicker than the first dielectric, which results in a low-power MIM fin capacitor. Accordingly, in implementations of the invention, the operating characteristics of the MIM fin capacitor are configured by selectively forming the first and second dielectrics at different thicknesses.

Figure 12:
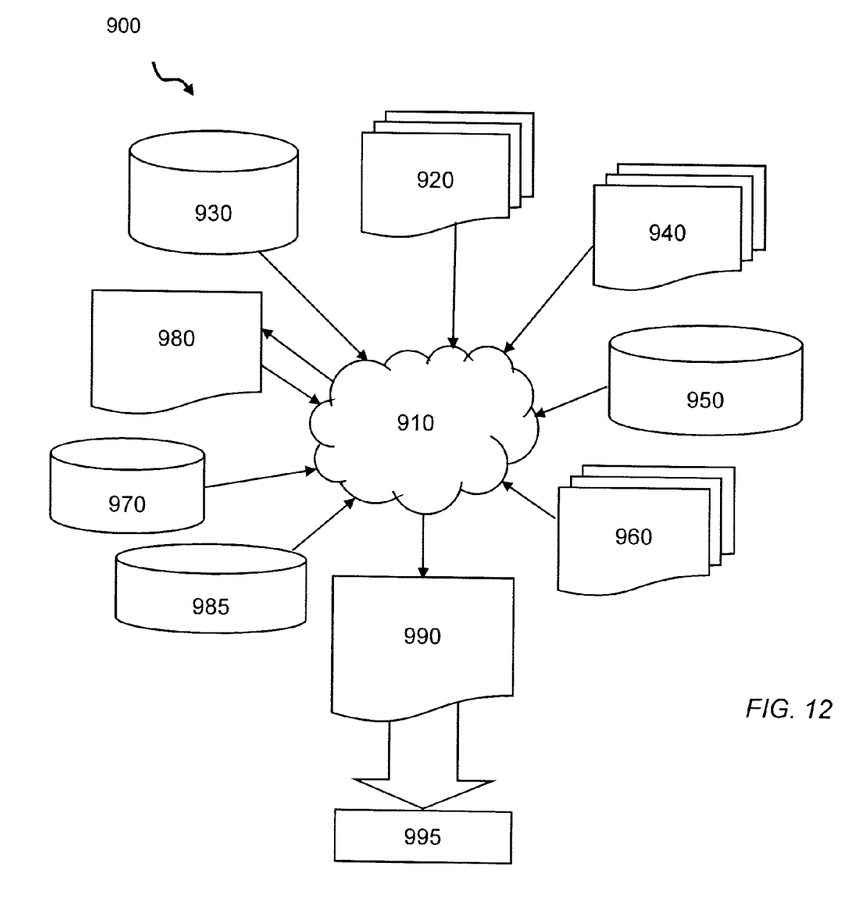
FIG. 12 is a flow diagram of a design process used in semiconductor design, manufacture, and/or test.

FIG. 12 is a flow diagram of a design process used in semiconductor design, manufacture, and/or test. FIG. 12 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-7, 8A, 8B, 9A, 9B, 10, 11A, and 11B. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 12 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-7, 8A, 8B, 9A, 9B, 10, 11A, and 11B. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-7, 8A, 8B, 9A, 9B, 10, 11A, and 11B to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-7, 8A, 8B, 9A, 9B, 10, 11A, and 11B. In one embodiment, design structure 990 may comprise a compiled, executable HDL simulation model that functionally simulates the devices shown in FIGS. 1-7, 8A, 8B, 9A, 9B, 10, 11A, and 11B.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-7, 8A, 8B, 9A, 9B, 10, 11A, and 11B. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method of fabricating a semiconductor structure, comprising:
    forming a first fin, a second fin, and a third fin of semiconductor material on a buried insulator layer atop a substrate;
    forming a first finFET comprising a first dielectric and a first conductor on the first fin;
    forming a second finFET comprising a second dielectric and a second conductor on the third fin;
    forming a fin capacitor comprising the first conductor, the second dielectric, and the second conductor on the second fin; and
    forming source and drain regions in the first finFET and the second finFET by implanting ions in the first fin and the third fin.

2. The method of claim 1, wherein the forming a fin capacitor comprises:
    forming a first capacitor conductor with the first conductor;
    forming a second capacitor conductor with the second conductor; and
    forming a capacitor dielectric with the second dielectric.

3. The method of claim 2, further comprising forming the capacitor dielectric between the first capacitor conductor and the second capacitor conductor.

4. The method of claim 1, further comprising:
    simultaneously forming the first conductor in the first finFET and the fin capacitor; and
    simultaneously forming the second conductor in the second finFET and the fin capacitor.

5. The method of claim 1, further comprising forming the first dielectric of a different material than the second dielectric.

6. The method of claim 1, further comprising forming the first conductor of a different material than the second conductor, wherein:
    the first conductor comprises a first metal;
    the second conductor comprises a second metal; and
    the fin capacitor comprises a metal-insulator-metal (MIM) fin capacitor.

7. The method of claim 1, further comprising forming the first dielectric with a first thickness and the second dielectric with a second thickness different from the first thickness.

8. The method of claim 1, further comprising:
    forming the first dielectric with a first thickness; and
    forming the second dielectric with a second thickness, wherein the first thickness is about 1.5 to about 2 times greater than the second thickness.

9. The method of claim 1, further comprising:
    forming the first dielectric with a first thickness; and
    forming the second dielectric with a second thickness, wherein the second thickness is about 1.5 to about 2 times greater than the first thickness.

10. The method of claim 1, wherein the fin capacitor comprises:
    a layer of the first dielectric on the second fin and the buried insulator layer; and
    a layer of the first conductor on the layer of the first dielectric.

11. The method of claim 1, further comprising etching unmasked portions of the first conductor, wherein the etching forms a discontinuity in the first conductor between the first fin and the second fin and removes the first conductor from the third fin.

12. A method of fabricating a semiconductor structure, comprising:
    forming first, second, third, and fourth fins of semiconductor material on a buried insulator layer atop a substrate;
    forming a first finFET comprising a first dielectric and a first conductor on the first fin;
    forming a second finFET comprising a second dielectric and a second conductor on the second fin;

forming a metal-insulator-metal (MIM) fin capacitor comprising the first conductor, the second dielectric, and the second conductor on the third and fourth fins; and forming source and drain regions in the first finFET and the second finFET by implanting ions in the first fin and the second fin, wherein the first finFET has a first threshold voltage and the second finFET has a second threshold voltage different from the first threshold voltage.

13. A method of fabricating a semiconductor structure, comprising:

forming a first fin, a second fin, and a third fin of semiconductor material on a buried insulator layer atop a substrate;

forming a layer of a first dielectric on the first fin, the second fin, the third fin, and an exposed upper surface of the buried insulator layer;

forming a layer of a first conductor on the layer of the first dielectric over the first fin, the second fin, and the third fin;

forming a mask on the first conductor over the first fin and the second fin, wherein the mask leaves a first unmasked area between the first fin and the second fin and a second unmasked area surrounding the third fin;

removing the first dielectric and the first conductor from over the third fin and from between the first fin and the second fin by simultaneously etching the first unmasked area and the second unmasked area;

forming a layer of a second dielectric over the first fin, the second fin, and the third fin;

forming a layer of a second conductor over the first fin, the second fin, and the third fin; and removing the second dielectric and the second conductor from over the first fin and from between the second fin and the third fin.

14. The method of claim 13, further comprising forming polysilicon on the first conductor over the first fin and on the second conductor over the third fin.

15. The method of claim 14, further comprising:

patterning the polysilicon, the first conductor, and the first dielectric to form a first gate on the first fin; and patterning the polysilicon, the second conductor, and the second dielectric to form a second gate on the third fin.

16. The method of claim 15, further comprising:

forming gate contacts on the first gate and the second gate;

forming source/drain regions in the first and third fin using ion implantation;

forming source/drain contacts on the first fin and the third fin;

forming at least one first capacitor contact on the first conductor adjacent the second fin; and forming at least one second capacitor contact on the second conductor adjacent the second fin.

17. The method of claim 13, further comprising:

forming the first dielectric of a first material and a first thickness;

forming the second dielectric of a second material different than the first material and with a second thickness different than the first thickness;

forming the first conductor of a third material; and forming the second conductor of a fourth material different than the third material.

18. The method of claim 13, wherein the removing the second dielectric and the second conductor from over the first fin and from between the second fin and the third fin comprises:

masking the second fin and the third fin, wherein the masking creates a third unmasked area surrounding the first fin and a fourth unmasked area between the second fin and the third fin; and simultaneously etching the third unmasked area surrounding the first fin and the fourth unmasked area between the second fin and the third fin.

19. The method of claim 18, wherein:

the fourth unmasked area between the second fin and the third fin includes a portion of the first conductor associated with the fin capacitor; and the etching the fourth unmasked area exposes the portion of the first conductor associated with the fin capacitor and creates a discontinuity in the second dielectric and the second conductor between the second fin and the third fin.

20. The method of claim 13, further comprising exposing a portion of the first conductor adjacent the second fin by removing a portion of the second conductor and a portion of the second dielectric adjacent the second fin.

21. The method of claim 20, wherein the removing the portion of the second conductor and the portion of the second dielectric adjacent the second fin and the removing the second dielectric and the second conductor from over the first fin are performed simultaneously.

22. The method of claim 13, wherein:

the removing the first dielectric and the first conductor from over the third fin exposes a top surface and side surfaces of the semiconductor material of the third fin; and the forming the layer of the second dielectric over the first fin, the second fin, and the third fin comprises depositing the second dielectric on: the top surface and side surfaces of the semiconductor material of the third fin, and a portion of the buried insulator layer between the first fin and the second fin.

23. A semiconductor structure, comprising:

first, second, and third fins of semiconductor material on a buried insulator layer atop a substrate;

a first finFET comprising a portion of a layer of a first dielectric and a portion of a layer of a first conductor on the first fin, wherein the first finFET comprises first source and drain regions at doped portions of the first fin;

a second finFET comprising a portion of a layer of a second dielectric and a portion of a layer of a second conductor on the third fin, wherein the second finFET comprises second source and drain regions at doped portions of the third fin; and a fin capacitor comprising another portion of the layer of the first conductor, another portion of the layer of the second dielectric, and another portion of the layer of the second conductor on the second fin, wherein the fin capacitor comprises a metal-insulator-metal (MIM) fin capacitor.

24. The structure of claim 23, wherein:

the first dielectric has a first thickness;

the second dielectric has a second thickness; and one of the following: the first thickness is about 1.5 to about 2 times larger than the second thickness, or the second thickness is about 1.5 to about 2 times larger than the first thickness.

25. The structure of claim 23, wherein:

the first finFET is formed on the first fin;

the fin capacitor is formed on the second fin;

the second finFET is formed on the third fin;

respective portions of the layer of the first conductor are a first capacitor conductor of the fin capacitor and a gate conductor of the first finFET;

respective portions of the layer of the second conductor are a second capacitor conductor of the fin capacitor and a gate conductor of the second finFET; and respective portions of the layer of the second dielectric are a capacitor dielectric of the fin capacitor and a gate dielectric of the second finFET.

26. The structure of claim 23, wherein the layer of the first conductor is composed of a different material than the layer of the second conductor.

27. The structure of claim 23, wherein the first finFET has a first threshold voltage and the second finFET has a second threshold voltage different from the first threshold voltage.

* * * * *